DELAY-ACTION FITTER CIRCUIT

Filed Oct. 22, 1949

INVENTOR
HALLEY WOLFE
BY
Hugh S. Wertz
ATTORNEY

Patented Feb. 12, 1952

2,585,890

UNITED STATES PATENT OFFICE 2,585,890

DELAY-ACTION FILTER CIRCUIT

Halley Wolfe, North Hollywood, Calif., assignor to Western Electric Company, Incorporated, New York, N. Y., a corporation of New York Application October 22, 1949, Serial No. 123,001

2 Claims. (Cl. 179—171)

This invention relates to electric circuits and more specifically to a delay action filter circuit.

It is an object of this invention to reduce spurious voltage components introduced in certain types of filter circuits.

In one well-known form of backward-acting gain control circuit, a part of the output is rectified and the resultant direct-current voltage is returned to be used as a bias for a control element of a preliminary stage. A resistance with a condenser shunt is used to filter the ripple component in the rectified voltage. Good filtering is important for any ripple appears as a spurious signal on the control element and causes a distortion in the output. However, it has been found that this parallel arrangement of condenser and resistance gives insufficient filtering, particularly of the low frequency ripple components. It is not feasible to improve the filtering action of this resistance-condenser circuit because this involves increasing the time constant of the gain control circuit. A minimum time constant is a requisite to insure quick response to output changes, a factor very important in the proper operation of compressors, expanders, etc. This invention, in one of its more important aspects, relates to an arrangement giving improved filtering action without a corresponding change in the time constant.

Another object of this invention is to minimize the distortion introduced into an amplifying system by a gain control circuit of the type just described.

In accordance with the invention, there is provided a delay action filter circuit which gives improved filtering. In this circuit, two condensers are charged by different fluctuating voltages, which voltages can be derived from a single source, if desired. The discharge path of the first condenser includes a unilaterally-conductive element such that the voltage across it is maintained at its peak value so long as the voltage across the second condenser is greater in a predetermined direction and for an additional interval determined by the time constant of the second condenser. This delay action serves to filter out all frequency components which have a period less than this delay interval. This filter circuit can be used, for example, in backward-acting gain control circuits of the type briefly described above.

Figure 1:
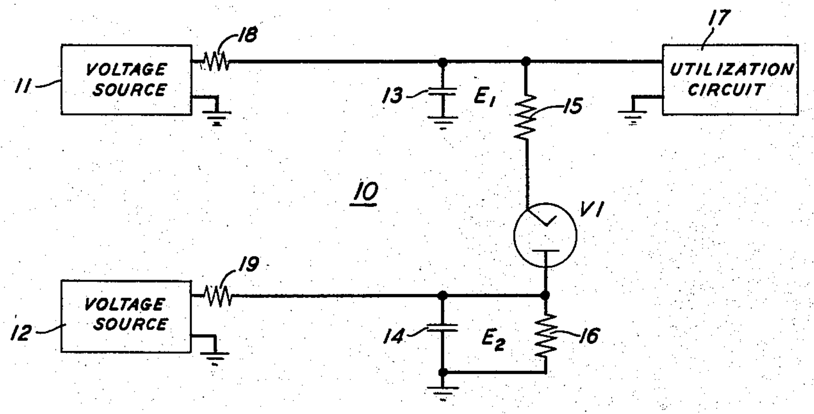
Figure 2:
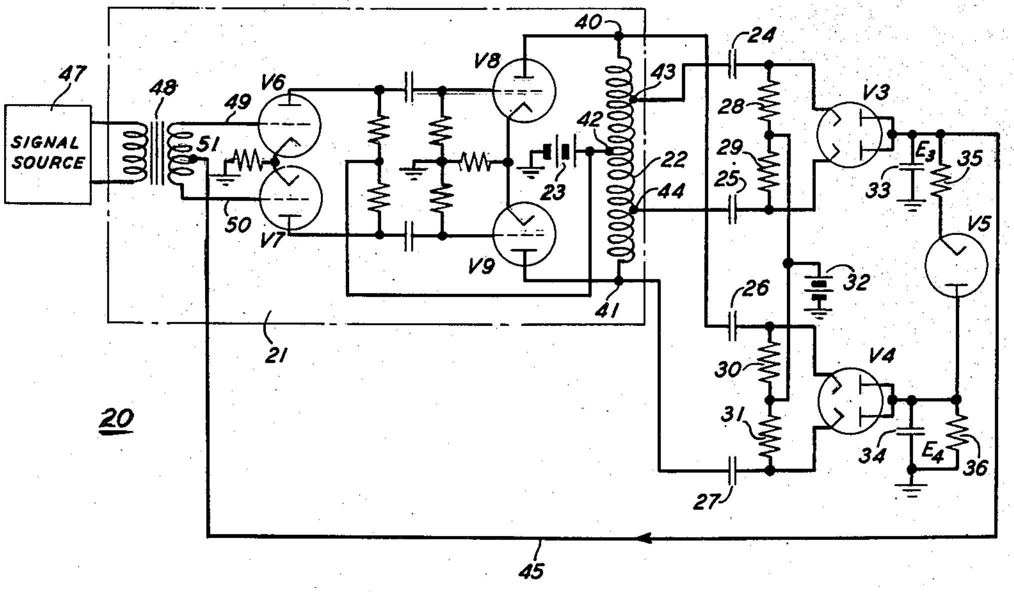

The invention will be more readily understood by referring to the following description taken in connection with the accompanying drawing forming a part thereof, in which:

Fig. 1 illustrates a time delay filtering circuit in accordance with the invention; and Fig. 2 is a circuit diagram of a gain control system for a push-pull amplifier embodying a delay action filter circuit in accordance with the invention.

Referring more particularly to the drawing, Fig. 1 illustrates, by way of example for purposes of illustration, a time delay filter circuit 10 in accordance with the invention. In this figure, two voltage sources 11 and 12 are shown. Source 11 is shown connected through a resistance 18 to one side of a condenser 13 and source 12 is connected through resistance 19 to one side of a condenser 14. The other sides of the two condensers are grounded. The ungrounded side of condenser 13 is connected through resistance 15 to the cathode of V1, a diode, and is also connected to a utilization circuit 17. The ungrounded side of condenser 14 is connected to the plate of tube V1 and also through resistance 16 to ground. Because of the unidirectional nature of source 11, the charge on condenser 13 is maintained unless some other discharge path is available. The available paths consist of one by way of the utilization circuit 17 and another by way of diode V1. If the utilization circuit offers a high impedance as is the case when the control voltage is supplied to a control element of an electron discharge device, the only feasible discharge path is that through diode V1. (V1 is here shown as a diode for purposes of illustration, but may be any unidirectional conductivity device.) Because of this characteristic of diode V1, the voltage $E_1$ across condenser 13 remains steady at its peak value undisturbed by the voltage $E_2$ across condenser 14 so long as the voltage $E_2$ is at a greater negative potential. As the voltage of source 12 decreases, voltage $E_2$ tends to change in the same way, since the charge on condenser 14 has a ready discharge path through resistance 16. However, there is a lag determined by the time constant of the parallel arrangment of condenser 14 and resistance 16. As a result, though source 12 decreases below voltage $E_1$, voltage $E_1$ is maintained steady for the time it takes condenser 14 to discharge sufficiently through resistance 16 so that voltage $E_2$ becomes less than voltage $E_1$. At this time, the plate of the tube V1 is positive with respect to the cathode, so that the tube conducts and offers a low impedance path for the discharge of condenser 13. By the choice of suitable condensers 13 and 14 and resistances 15 and 16, this delay interval can be adjusted to a desired value. The voltage $E_1$ is supplied to the utilization circuit for the use desired.

Fig. 2 illustrates a specific embodiment 20 in accordance with the invention which comprises a push-pull amplifier with a fast acting gain control. The amplifier 21 is of a conventional push-pull type. It is fed from a signal source 47 which supplies the signal through the input transformer 48 to the control grids 49 and 50 of tubes V6 and V7. The amplified signal is further amplified by tubes V8 and V9, and a balanced output is developed across the load resistance 22. The center tap 42 of resistance 22 is connected to the positive terminal of the supply 23 of direct potential, the negative terminal of which is grounded. One external terminal 40 of resistance 22 is connected to one side of condenser 26, and the other external terminal 41 to one side of condenser 27. The other sides of condensers 26 and 27 are connected respectively to separate cathodes of the tube V4 which is a dual-diode operated as a conventional full-wave rectifier. The separate cathodes of diode V4 are also connected, through resistances 30 and 31, respectively, to the positive terminal of supply 32 of direct potential, the negative terminal of which is grounded. One side of each of condensers 24 and 25 is connected to a respective one of the inner taps 43 and 44 of resistance 22 (on opposite sides of the center tap 42). The other sides are each connected to a separate cathode of tube V3 which is also a dual-diode operated as a full-wave rectifier. The cathodes of diode V3 are biased positively by connections through resistances 28 and 29 respectively to the positive terminal of source 32. The two plates of diode V3 are connected to one terminal of condenser 33, the other terminal of which is grounded. Similarly, the two plates of tube V4 are connected to one terminal of condenser 34, the other terminal of which is grounded. The ungrounded terminal of condenser 33 is also connected through the connection or wire 45 back through center tap 51 of transformer 48 to control elements 49 and 50 of a preliminary stage of the amplifier 21. This ungrounded terminal of condenser 33 is also connected through resistance 35 to the cathode of a diode V5 whose plate is connected to the ungrounded side of condenser 34 and to one side of resistance 36 which is in shunt across condenser 34.

The operation of the circuit 20 shown in Fig. 2 will now be described. For the sake of simple analysis, suppose that a large sinusoidal signal is suddenly impressed on the amplifier. Part of the signal voltage developed across the output resistance 22 (the part developed between taps 43 and 44) is rectified by dual-diode V3 which acts as a full-wave rectifier. Similarly, the whole of the output signal is rectified by dual-diode V4. Condensers 24, 25, 26 and 27 merely serve to block the direct voltage components. The cathodes of diodes V3 and V4 are biased to a positive voltage by the voltage source 32. This serves to keep diodes V3 and V4 non-conducting until the signal voltages used for rectification have exceeded this bias and this makes it possible to fix the output level at which the gain control takes effect. The resultant voltages $E_3$ and $E_4$ on the plates of the tubes V3 and V4 are both negative but inasmuch as the tube V4 has applied to it the whole of the signal output developed across resistance 22, voltage $E_4$ is more negative than voltage $E_3$. Condensers 33 and 34 are also charged to voltages $E_3$ and $E_4$. The charge on condenser 33 has only one feasible discharge path. This is by way of the element V5 which can be any unidirectional conductivity device, but is here shown as a diode. Diode V5 is connected so as to pass current only when voltage $E_4$ is positive with respect to voltage $E_3$. Hence, so long as voltage $E_4$ is more negative, condenser 33 is unable to discharge and voltage $E_3$ is maintained at its peak, free from any ripple components. This negative voltage $E_3$ is utilized as a control bias in an early stage of amplifier 21 as shown in the drawing and serves to reduce the gain of the amplifier. As the signal across resistance 22 decreases, the voltages across diodes V3 and V4 decrease, but the voltages $E_3$ and $E_4$ are maintained until the charges on condensers 33 and 34 leak off. The charge on condenser 34 has a ready discharge path through resistance 36, so that voltage $E_4$ decreases at a rate determined by the time constant of the parallel combination of resistance 36 and condenser 34. Hence, even after the signal across the output resistance 22 falls off, voltage $E_3$ is kept steady until sufficient charge has leaked off condenser 34 so that voltage $E_4$ has become positive with respect to voltage $E_3$ and permits the discharge of condenser 33 through diode V5. By a proper selection of the values of resistances 35 and 36 and condensers 33 and 34, the rate of discharge and thus the delay interval can be adjusted to the desired characteristics. This arrangement serves to filter from voltage $E_3$ all ripple components whose frequencies have a period less than this delay interval.

It is to be understood that the above-described arrangements are illustrative of the invention. Numerous other arrangements may be devised by those skilled in the art without departing from the spirit and scope of the invention.

What is claimed is:

1. A control circuit for regulating the output of an amplifier comprising an element across which the output is developed, a first rectifier connected across a portion of said output element and actuated when the output exceeds a predetermined level, a second condenser connected across a lesser portion of said output element and actuated when the output exceeds a predetermined level, a first condenser one terminal of which is connected to the first rectifier and the other terminal of which is at a reference potential, a second condenser one terminal of which is connected to the second rectifier and the other terminal of which is at a reference potential, a unidirectional conductivity element between the two terminals not at a reference potential of the condensers, a resistance in shunt across said second condenser, and means for utilizing the output of said first rectifier.

2. A gain control circuit for use with an amplifier comprising an element across which is developed an output voltage, means connected across said output element and energized when said output voltage exceeds a predetermined level for producing a first unidirectional voltage, means connected across a lesser portion of said output element and rendered active when said output voltage exceeds a predetermined level for producing a second unidirectional voltage, a first and a second condenser for maintaining said first and second unidirectional voltages, means connected between said first and second condensers for keeping steady the first unidirectional voltage at its peak value as long as there is a potential difference in a predetermined direction between said first and second unidirectional voltages, means for discharging said second condenser, and means for utilizing the first steady unidirectional voltage.

HALLEY WOLFE.

REFERENCES CITED

The following references are of record in the file of this patent:

UNITED STATES PATENTS

| Number | Name | Date |
|---|---|---|
| 2,144,605 | Beers | Jan. 24, 1939 |
| 2,240,593 | Wilson | May 6, 1941 |
| 2,346,020 | Gillespie, Jr. | Apr. 4, 1944 |
| 2,363,813 | Somers | Nov. 28, 1944 |
| 2,462,452 | Yates | Feb. 22, 1949 |
| 2,515,196 | Coe | July 18, 1950 |